United States Patent
Levin et al.

(10) Patent No.: US 6,567,567 B1
(45) Date of Patent: *May 20, 2003

(54) SAMPLING AND RECONSTRUCTION OF RF SIGNALS

(75) Inventors: David N. Levin, Chicago, IL (US); Scott Nagle, Oak Park, IL (US)

(73) Assignee: ARCH Development Corp., Chicago, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/490,412

(22) Filed: Jan. 24, 2000

Related U.S. Application Data

(62) Division of application No. 09/061,513, filed on Apr. 15, 1998, now Pat. No. 6,018,600.

(51) Int. Cl.[7] .............................................. G06K 9/36
(52) U.S. Cl. ......................................... 382/284; 382/128
(58) Field of Search ................................ 382/284, 131, 382/199, 260, 266, 280, 282, 294, 128

(56) References Cited

U.S. PATENT DOCUMENTS

| | | | | |
|---|---|---|---|---|
| 4,324,002 A | * | 4/1982 | Spilker, Jr. ................. | 455/27 |
| 4,644,526 A | * | 2/1987 | Wu ............................. | 370/30 |
| 4,908,573 A | * | 3/1990 | Kaufman et al. ........... | 324/309 |
| 5,276,614 A | * | 1/1994 | Heuscher .................... | 364/413.16 |
| 5,305,204 A | * | 4/1994 | Ohhashi ...................... | 364/413.13 |
| 5,537,435 A | * | 7/1996 | Carney et al. ............... | 375/219 |
| 5,621,786 A | * | 4/1997 | Fischer et al. .............. | 379/60 |
| 5,802,044 A | * | 9/1998 | Baum et al. ................. | 370/330 |
| 5,933,421 A | * | 8/1999 | Alamouti et al. ........... | 370/330 |
| 5,943,324 A | * | 8/1999 | Ramesh et al. ............. | 370/321 |
| 6,065,060 A | * | 5/2000 | Liu et al. ..................... | 709/233 |
| 6,128,592 A | * | 10/2000 | Miyazaki et al. .......... | 704/224 |
| 6,173,164 B1 | * | 1/2001 | Shah .......................... | 455/182.1 |

* cited by examiner

*Primary Examiner*—Yon J. Couso
(74) *Attorney, Agent, or Firm*—Welsh & Katz, Ltd.

(57) ABSTRACT

A method and apparatus are provided for transceiving a signal. The method includes the steps of transmitting a superposed frequency component of the signal within each of a plurality of non-adjacent frequency bands, using analogue or digital filters within a receiver to suppress all signals outside the plurality of frequency bands and to pass a filtered signal within the plurality of non-adjacent frequency bands, determining a set of substantially non-uniformly spaced times at which the filtered signal within the plurality of non-adjacent frequency bands should be sampled and sampling the filtered signal at the determined times to provide sampled data. The method further includes the steps of Fourier transforming subsets of the sampled data, linearly combining the Fourier transformed subsets using a reconstruction matrix and extracting the signal from the linear combinations of the Fourier transformed subsets.

34 Claims, 6 Drawing Sheets

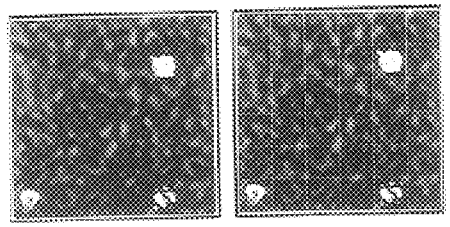
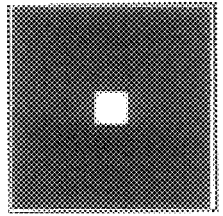
Fig. 2a  Fig. 2b
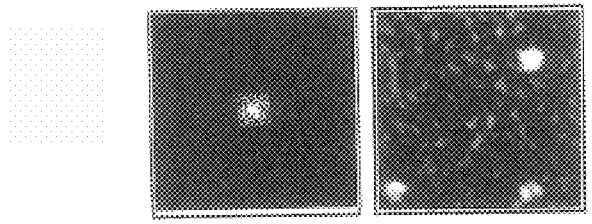
Fig. 2c
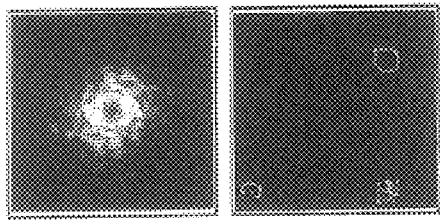
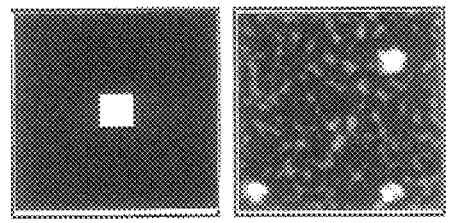
Fig. 2d  Fig. 2e
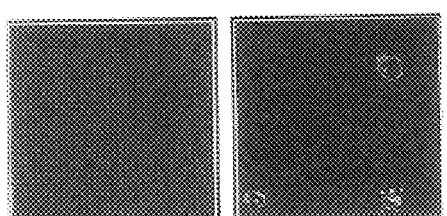
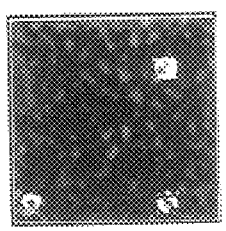
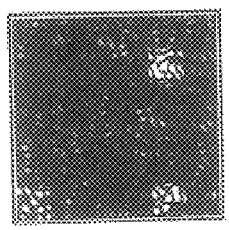
Fig. 2f  Fig. 2g  Fig. 2h

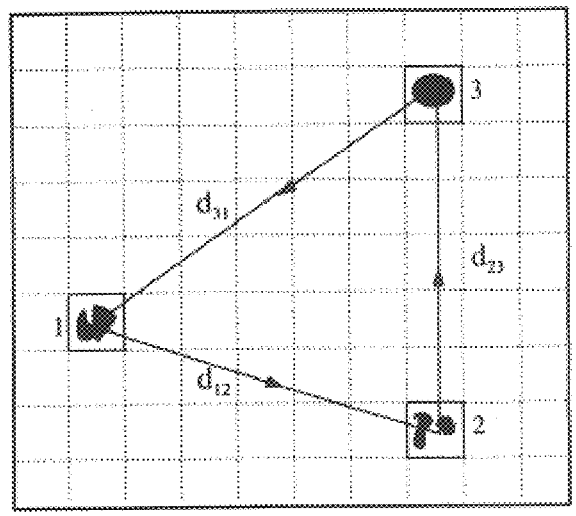
Fig. 3
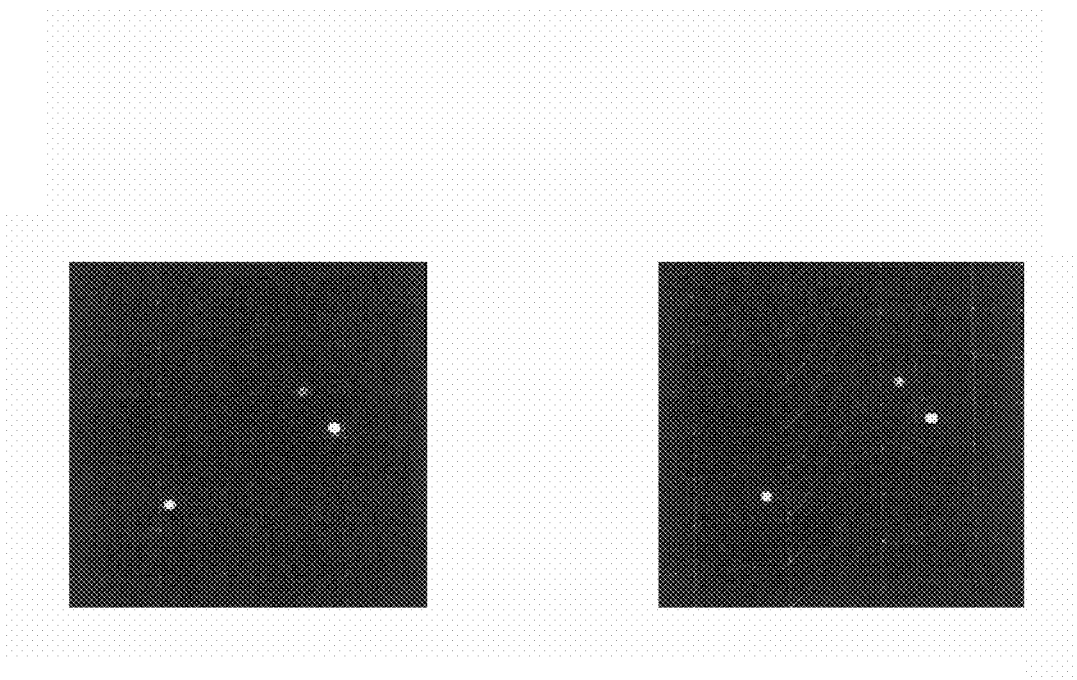
Fig. 4a  Fig. 4b

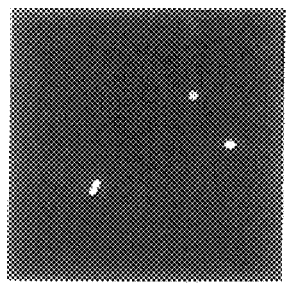
Fig. 5a
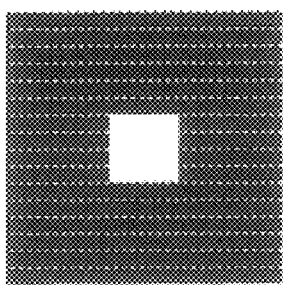
Fig. 5b
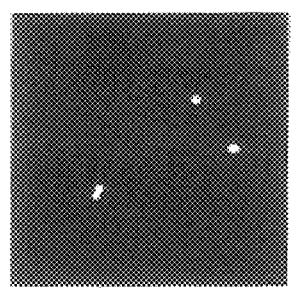
Fig. 5c
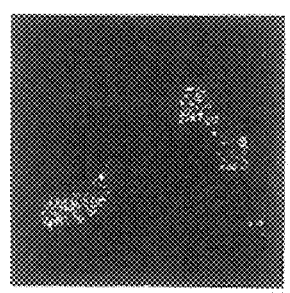
Fig. 5d
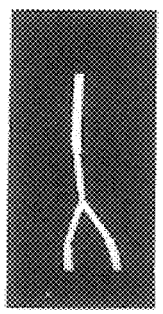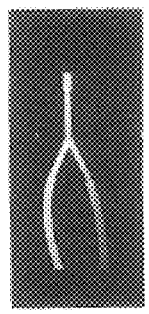
Fig. 5e
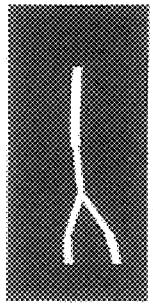
Fig. 5f
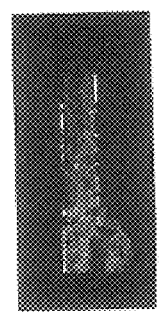
Fig. 5g

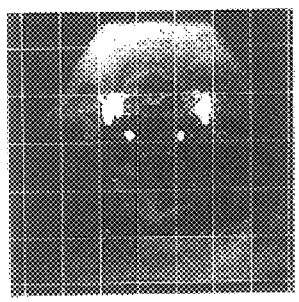
Fig. 6a
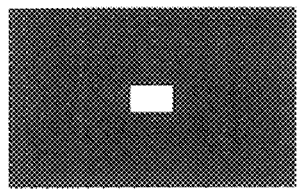
Fig. 6b
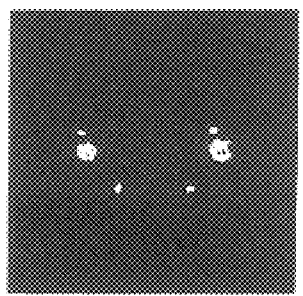
Fig. 6c
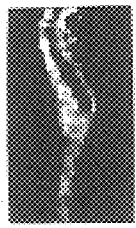
Fig. 6d
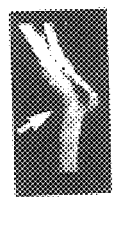
Fig. 6e
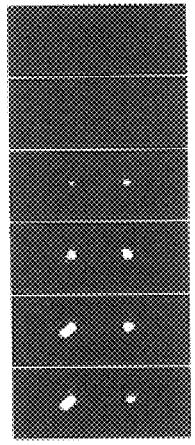
Fig. 7

SAMPLING AND RECONSTRUCTION OF RF SIGNALS

This is a division of application Ser. No. 09/061,513, filed Apr. 15, 1998 now U.S. Pat. No. 6,018,600.

The U.S. Government has a paid-up license in this invention and the right in limited circumstances to require the patent owner to license others on reasonable terms as provided for by the terms of Grant #HD32665 as awarded by the National Institute of Health.

FIELD OF THE INVENTION

The field of the invention relates to sampling and reconstruction of signals and images including MR images of multiple regions.

BACKGROUND OF THE INVENTION

MR imaging is most commonly performed with 2D FT or 3D FT techniques, which require only a modest amount of prior knowledge about the object: 1) the object is assumed to be completely contained within a finite field of view (FOV); 2) the image is assumed to be band-limited in frequency space; i.e. its significant power spectrum does not extend beyond some maximum spatial frequency. If these two assumptions are valid, the usual sampling theorem (due to Whittaker, Kotel'nikov, and Shannon, or WKS, (1–4)) states that the image can be reconstructed by an inverse FT of a finite number of discrete samples of the image's k-space representation. The spacing between the sampled k-space points is determined by the first assumption (the dimensions of the FOV), and the limits of the k-space sampling pattern are determined by the second assumption (the maximum spatial frequencies in the image). This method is widely used because: 1) it is based on relatively weak assumptions about the image, 2) it is relatively easy to acquire the Fourier-encoded signals stipulated by the WKS theorem, and 3) image reconstruction can be performed efficiently with a fast FT (FFT).

In contrast-enhanced carotid artery imaging, interventional imaging, functional imaging, cardiac imaging, and a number of other applications, the utility of MRI is limited by the speed with which the k-space data can be measured. Two general strategies have been used to shorten image acquisition time. 1) Gradient pulses with shorter rise times and/or larger amplitudes have been used in order to shorten the time required to gather a complete WKS data set. Unfortunately, gradient ramp rates and strengths are now approaching values at which neuromuscular stimulation can compromise patient safety and comfort. 2) More stringent assumptions can be made about the image in order to reduce the number of signals necessary to reconstruct it. Some of these "constrained imaging" methods simply apply WKS sampling with stronger assumptions in order to increase the spacing between k-space points (reducing the FOV) or to reduce the k-space sampling limits (reducing image resolution). More novel approaches have utilized prior knowledge to express the image as a superposition of a small number of non-Fourier basis functions. The image's projections onto these basis functions are computed from a reduced set of Fourier-encoded signals, or they are measured directly by performing non-Fourier encoding.

In this invention, we take a different approach. We generalize the WKS sampling theorem so that it can be applied to images which are supported on multiple regions within the FOV. By using this "multiple region MR" (mrMR) sampling theorem, such images can be reconstructed from a fraction of the k-space samples required by the WKS theorem. Image reconstruction is performed with FFTs and without any noise amplification, just as in conventional FT MRI. In addition, we show how the method can be applied to a broader class of images having only their high contrast edges confined to known regions of the FOV. If this kind of prior knowledge is available, k-space can be sampled sparsely, and scan time can be reduced. The next section describes the theoretical framework of the mrMR approach. Then, the method is illustrated with simulated data and with experimental data from a phantom. Finally, we describe how the method was used to reduce the time of first-pass Gd-enhanced 3D carotid MRA so that it could be performed without bolus timing.

SUMMARY

A method and apparatus are provided for transceiving a signal. The method includes the steps of transmitting a superposed frequency component of the signal within each of a plurality of non-adjacent frequency bands, using analogue or digital filters within a receiver to suppress all signals outside the plurality of frequency bands and to pass a filtered signal within the plurality of non-adjacent frequency bands, determining a set of substantially non-uniformly spaced times at which the filtered signal within the plurality of non-adjacent frequency bands should be sampled and sampling the filtered signal at the determined times to provide, sampled data. The method further includes the steps of Fourier transforming subsets of the sampled data, linearly combining the Fourier transformed subsets using a reconstruction matrix and extracting the signal from the linear combinations of the Fourier transformed subsets.

Traditional Fourier MR imaging utilizes the Whittaker-Kotel'nikov-Shannon (WKS) sampling theorem. This specifies the spatial frequency components which need be measured to reconstruct an image with a known field of view (FOV) and band-limited spatial-frequency contents. In this paper, we generalize this result in order to find the optimal k-space sampling for images that vanish except in multiple, possibly non-adjacent regions within the FOV. This provides the basis for "multiple region MRI" (mrMRI), a method of producing such images from a fraction of the k-space samples required by the WKS theorem. Image reconstruction does not suffer from noise amplification and can be performed rapidly with fast Fourier transforms, just as in conventional FT MRI. The mrMRI method can also be used to reconstruct images that have low spatial-frequency components throughout the entire FOV and high spatial frequencies (i.e. edges) confined to multiple small regions. The greater efficiency of mrMR sampling can be parlayed into increased temporal or spatial resolution whenever the imaged objects have signal or "edge" intensity confined to multiple small portions of the FOV. Possible areas of application include MR angiography (MRA), interventional MRI, functional MRI, and spectroscopic MRI. The technique is demonstrated by using it to acquire Gd-enhanced first-pass 3D MRA images of the carotid arteries without the use of bolus-timing techniques.

BRIEF DESCRIPTION OF THE DRAWINGS

FIG. 2 depicts additional details of the schematic of FIG. 1;

FIG. 3 depicts an image supported on three cells that may be processed using the method of FIG. 1;

FIG. 4 depicts the application of the method of FIG. 1 and FIG. 2 to images of a phantom;

FIG. 5 depicts further details of the application of the method to the phantom images;

FIG. 6 depicts an image of a volunteer processed by the method of FIG. 1 and FIG. 2;

FIG. 7 depicts additional detail of the image of FIG. 6;

BRIEF DESCRIPTION OF A PREFERRED EMBODIMENT

A. General Approach

The mrMRI method of an illustrated embodiment of the invention is schematically outlined in FIGS. 1a–e. In FIG. 1a, the image to be reconstructed (top panel) vanishes except in three cells that covered the FOV (bottom panel). In FIG. 1b, the composite sampling pattern used to reconstruct the mrMR image from a small number of Fourier components is shown. This pattern is composed of a number of sparse grids, each offset by a different amount from the center of k-space. In this example, the data sampled at all of these points comprise just 1/12 of the WKS data set needed for reconstruction of the entire FOV with the same resolution. In FIG. 1c is shown the "reduced FOV" images, $S_a(x,y)$, which were produced by inverse FT of data on each of the sparse grids in panel b (FIG. 1b). Each of the images is a linear combinations of all the cell images, $I_j(x,y)$. Only the magnitudes of these complex images are shown. In FIG. 1d, the contents of each cell, found by linearly combining the "reduced FOV" images in panel c is shown. In FIG. 1e, the mrMR image, created by tiling the FOV with the cell images in panel d is shown. This image is windowed identically to the "exact" image in panel a.

Figure 8:
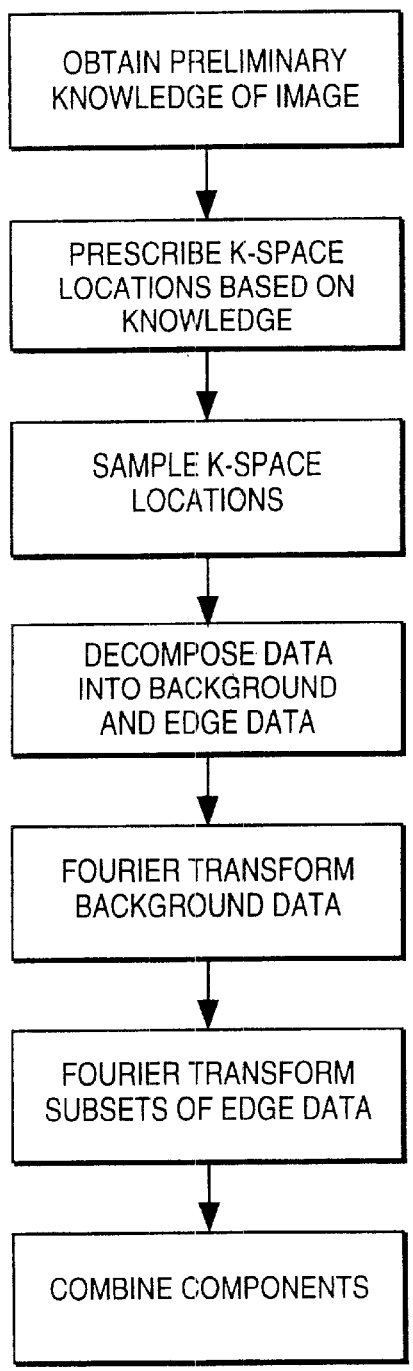
FIG. 8 depicts a flow chart of the method of FIG. 1 and FIG. 2.
Figure 9:
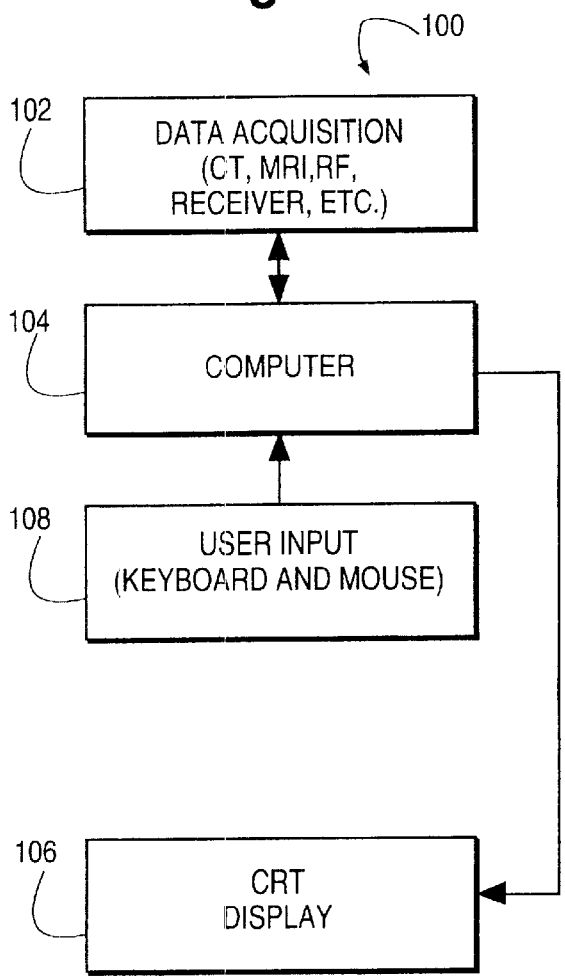
FIG. 9 is a block diagram of apparatus that may be used to practice the method of FIG. 1 and FIG. 2.

A flow chart of the process depicted in FIGS. 1a–e may be as shown in FIG. 8. Apparatus 100 that may be used to practice the process shown in FIGS. 1 and 8 may be as shown in FIG. 9. Reference shall be made to these figures as appropriate to understanding the invention.

Consider an arbitrary image in the xy-plane (top panel of FIG. 1a). Cover this plane with an infinite array of rectangular cells with any convenient dimensions ($\Delta x$ and $\Delta y$) along the x and y axes, respectively (bottom panel of FIG. 1a). If the image were supported on only one cell, the WKS sampling theorem would dictate that k-space be sampled by the data acquisition device 102 of FIG. 9 on a single coarse grid with spacing equal to $\Delta k_x = 2\pi/\Delta x$ and $\Delta k_y = 2\pi/\Delta y$ along the $k_x$ and $k_y$ axes, respectively. It can be shown that an image supported on C such cells can be reconstructed from sparse data on C (or more) such sparse grids, each grid being offset by a different amount from the center of k-space (FIG. 1b).

First, let I(x,y) be the image to be reconstructed, and denote its Fourier transform by $\tilde{I}(k_x,k_y)$:

$$\tilde{I}(k_x, k_y) \equiv \int I(x, y) e^{-ik_x x - ik_y y} dx dy \qquad (1)$$

$$I(x, y) = \frac{1}{4\pi^2} \int \tilde{I}(k_x, k_y) e^{ik_x x + ik_y y} dk_x dk_y,$$

where all integrations extend from minus infinity to plus infinity, unless specified otherwise. Define the "comb" sampling function, III(k), to be $$III(k) \equiv \sum_{n=-\infty}^{\infty} \delta(k - n). \qquad (2)$$

Next, define the function $\tilde{S}_a(k_x,k_y)$ to be $$\tilde{S}_a(k_x, k_y) \equiv III\left(\frac{k_x - k_{ax}}{\Delta k_x}\right) III\left(\frac{k_y - k_{ay}}{\Delta k_y}\right) \tilde{I}(k_x, k_y), \qquad (3)$$

where $\vec{k}_a(k_{ax},k_{ay})$ is the offset between the $a^{th}$ sampling grid and the origin of k-space; a=1, ..., A; and A is the number of coarse grids that are superposed to form a composite sparse sampling pattern. Equations (2) and (3) show that $\tilde{S}_a(k_x,k_y)$ simply represents the image's Fourier components on the $a^{th}$ grid and can be determined experimentally by measuring MR signals that are Fourier-encoded with the appropriate wave vectors. Taking the inverse FT of Eq. (3) produces (FIG. 1c)

$$S_a(x, y) = \sum_{m,n=-\infty}^{\infty} I(x + m\Delta x, y + n\Delta y) e^{-ik_{ax} m \Delta x - ik_{ay} n \Delta y}. \qquad (4)$$

Let the integers (m, n) label each cell in the xy-plane with respect to any convenient cell that is labeled (0, 0) and is centered at $(x_0,y_0)$ (FIG. 1a). Let us define $I_j(x,y)$ to be the function produced by translating the contents of the $j^{th}$ cell, located at cell coordinates $(m_j, n_j)$, to the cell at (0, 0):

$$I_j(x,y) \equiv I(x + m_j \Delta x, y + n_j \Delta y) \qquad (5)$$

for $x_0 - \Delta x/2 \leq x \leq x_0 + \Delta x/2$ $y_0 - \Delta y/2 \leq y \leq y_0 + \Delta y/2$ Then, in this domain of the xy-plane, Eq. (4) can be rewritten as $$S_a(x, y) = \sum_{j=0}^{\infty} I_j(x, y) e^{-ik_{ax} m_j \Delta x - ik_{ay} n_j \Delta y}, \qquad (6)$$

or in matrix notation $$\vec{S} = M \vec{I}, \qquad (7)$$

where $$\vec{S} = \begin{bmatrix} S_1 \\ S_2 \\ \vdots \\ S_A \end{bmatrix},$$

M is an A×∞ matrix with elements $$M_{aj} = e^{-ik_{ax} m_j \Delta x - ik_{ay} n_j \Delta y}, \qquad (8)$$

and $$\vec{I} = \begin{bmatrix} I_0 \\ I_1 \\ \vdots \\ I_\infty \end{bmatrix}.$$

In other words, each experimentally-determined function $S_a(x,y)$ is a linear combination of all the cell images $I_j(x,y)$. Notice that the contribution of each cell is weighted by a constant complex number, which depends on the offset of the coarse grid from the center of k-space ($\vec{k}_a$) and on the locations of the cells ($m_j$ and $n_j$).

Up to this point, no assumptions have been made about the image. Now let us apply a more flexible version of the WKS constraint on the FOV. Assume that only C of the cell images are non-zero; i.e. all of the remaining elements of $\vec{I}$ are zero. In this case the A×∞ matrix M can be replaced by an A×C matrix, and the ∞-dimensional vector $\vec{I}$ can be replaced with a C-dimensional vector, with j varying over only the non-vanishing cells. If we have measured data on A coarse grids (A≧C), we are left with a system of A equations in C unknowns. The C non-vanishing functions $I_j$ can be found by inverting the A linear equations of the form of Eqs. (6) and (7). The solution is $$I_j(x,y) = \sum_{a=1}^{A} [(M^+M)^{-1}M^+]_{ja} S_a(x,y), \quad (9)$$

$$j \in \text{non-zero cells},$$

or in matrix notation $$\vec{I} = M^{-1}\vec{S} = (M^+M)^{-1}M^+\vec{S}, \quad (10)$$

where $M^{-1}$ denotes the inverse (or pseudoinverse of A>C) and "+" denotes the adjoint (FIGS. 1d and 1e).

Notice that we have only imposed a spatial constraint on the image's region of support. We have not made any assumptions about the image's spatial frequency content within the signal-containing cells. This latter assumption determines the k-space limits (and therefore the total size) of each of the A sparse grids, and ultimately determines the resolution of the image within the cells.

B. Optimal Sampling

Equations (9) and (10) can be used to reconstruct the image from experimental data on A coarse k-space grids with appropriate offsets. Notice that the matrix M depends on the values of these offsets, as well as on the locations of the supporting cells (Eq. (8)). In the absence of noise, any offsets leading to a non-singular M can be used to accurately reconstruct the image, as long as the number of coarse sampling grids is at least as great as the number of non-zero cells in the image (i.e. A≧C). However, in the presence of noise, the conditioning of M (or equivalently M+M) determines the amount of noise amplification during reconstruction. Specifically, noise in the experimental data will be amplified during the reconstruction process to the extent that M is ill-conditioned (i.e. to the extent that some of the eigenvalues of $M^+M$ are much smaller than others). Therefore, one expects that image noise will be minimized if the k-space offsets are chosen so that these eigenvalues are all equal.

To prove this, we use Eqs. (9) and (10) to calculate the mean squared noise propagating from the experimental data into the reconstructed image $\tilde{I}(x,y)$. Assume that the root-mean-squared noise in $\tilde{I}(k_x,k_y)$ is $\epsilon$ and that there is no correlation between the noise at different k-space locations. Then, it follows from Eqs. (9) and (10) that the mean squared noise in the image is:

$$\left\langle \frac{1}{C\Delta x \Delta y} \int_{support} |\delta I(x,y)|^2 \, dx dy \right\rangle = \frac{N_x \Delta k_x N_y \Delta k_y}{4\pi^2 C \Delta x \Delta y} \epsilon^2 Tr[(M^+M)^{-1}], \quad (11)$$

where the brackets denote the statistical average, the integral extends over the C cells that support I, and each coarse k-space grid has the dimensions $N_x \times N_y$. The trace on the right side is equal to $$Tr[(M^+M)^{-1}] = \sum_{i=1}^{C} \frac{1}{\mu_i}, \quad (12)$$

where $\mu_i$ denotes the $i^{th}$ eigenvalue of the C×C Hermitian matrix $M^+M$. Notice that Eq. (8) implies that these eigenvalues must lie on a hyperplane in $\mu$-space defined by $$\sum_{i=1}^{C} \mu_i = Tr(M^+M) = CA. \quad (13)$$

Straight-forward application of multivariable calculus shows that the trace in Eq. (12) has a global minimum on this hyperplane when all $\mu_i = A$ (i=1, ..., C). Therefore, as we expected, the level of noise in an mrMR image is minimized when the A coarse sampling pattern offsets are chosen such that these eigenvalues are all equal. Notice that for this optimal sampling pattern, $$Tr[(M^+M)^{-1}] = \frac{C}{A} = \frac{1}{NEX},$$

where $$NEX \equiv \frac{A}{C}$$

is the ratio of the number of acquired k-space points to the minimal number.

Notice that the eigenvalues of $M^+M$ are equal to one another if and only if this matrix is equal to A times a C×C identity matrix. Using the definition of M (Eq. (8)), $M^+M$ has this form if and only if $$\sum_{a=1}^{A} e^{i\vec{k}_a \cdot \vec{d}_{jj'}} = 0 \quad (14)$$

for all unequal j and j', where $\vec{d}_{jj'}$ is the displacement vector between the centers of any two supporting cells, located at ($m_j$, $n_j$) and ($m_{j'}$, $n_{j'}$). Equation (14) shows explicitly how the optimal offsets of the sampling pattern ($\vec{k}_a$) are determined by our prior knowledge of the locations of the supporting cells ($\vec{d}_{jj'}$). Notice that Eq. (14) only depends on the relative locations of the supporting cells. Therefore, the optimal sampling pattern is not changed if the cell array is translated across the FOV in order to most efficiently contain the intensity distribution of a particular image.

To summarize, we have shown that the offsets of the A coarse k-space grids should be chosen so that Eq. (14) is satisfied for all pairs of supporting cells. If this can be achieved, image reconstruction (Eqs. (9) and (10)) will be perfectly well-conditioned, and image noise will be minimized. In fact, the level of noise will be the same as in a conventional (WKS sampled) FT image having the same resolution over an equal area of support (i.e. over a rectangular FOV with area equal to C $\Delta x$ $\Delta y$). This last statement is a consequence of the following two facts: 1) the level of noise in an mrMR image does not depend on the positions of the supporting cells; 2) if the supporting cells are rearranged into a rectangular array (e.g. into a single row of adjacent cells), the WKS sampling pattern is an optimal (mrMR) sampling pattern. The first fact follows immediately from Eq. (11) and the fact that $Tr[(M^+M)^{-1}]$ is independent of the supporting cells' positions; namely, for an optimal sampling pattern, it is equal to $$\frac{C}{A} \text{ or } \frac{1}{NEX}.$$

To understand the second statement, imagine that the supporting cells form an $N_x \times N_y$ rectangular array. The WKS sampling pattern for this "reduced FOV" can be broken down into a composite of $A=N_xN_y$ coarse k-space grids, having the offsets:

$$(k_{ax}, k_{ay}) = \left(\frac{p_a}{N_x}\Delta k_x, \frac{q_a}{N_y}\Delta k_y\right),$$

where $p_a=0, 1, \ldots, N_x-1$ and $q_a=0, 1, \ldots, N_y-1$. For these offsets, the mrMR matrix element $M_{aj}$ in Eq. (8) is $e^{-2\pi i p_a m_j/N_x}e^{-2\pi i q_a n_j/N_y}$. Each of these factors is a component of a discrete Fourier function. It follows from their completeness and orthogonality that $M^+M=N_xN_yI=A I$, where I is the identity matrix. Therefore, the WKS sampling pattern leads to an $M^+M$ matrix having all eigenvalues equal to A, proving the assertion that it is also an optimal mrMR sampling pattern. Therefore, we have proved that the noise level in an mrMR image is the same as that for a WKS image of a rectangular region formed by the rearrangement of the supporting cells.

C. Filtered MRI

We now show how the system 100 may use a variant of mrMRI to reconstruct an image that has non-zero intensity throughout the entire FOV but has high contrast edges confined to multiple regions within the FOV. Suitable filters can be used to decompose such an image into the sum of a slowly undulating "background" component and an "edge" component that is only supported on small portions of the FOV. The former component can be reconstructed from data in a small "keyhole" at the center of k-space, and the latter component can be reconstructed from sparse k-space data in an optimal mrMR sampling pattern. FIG. 2 outlines this filtered mrMRI technique.

Figure 1:
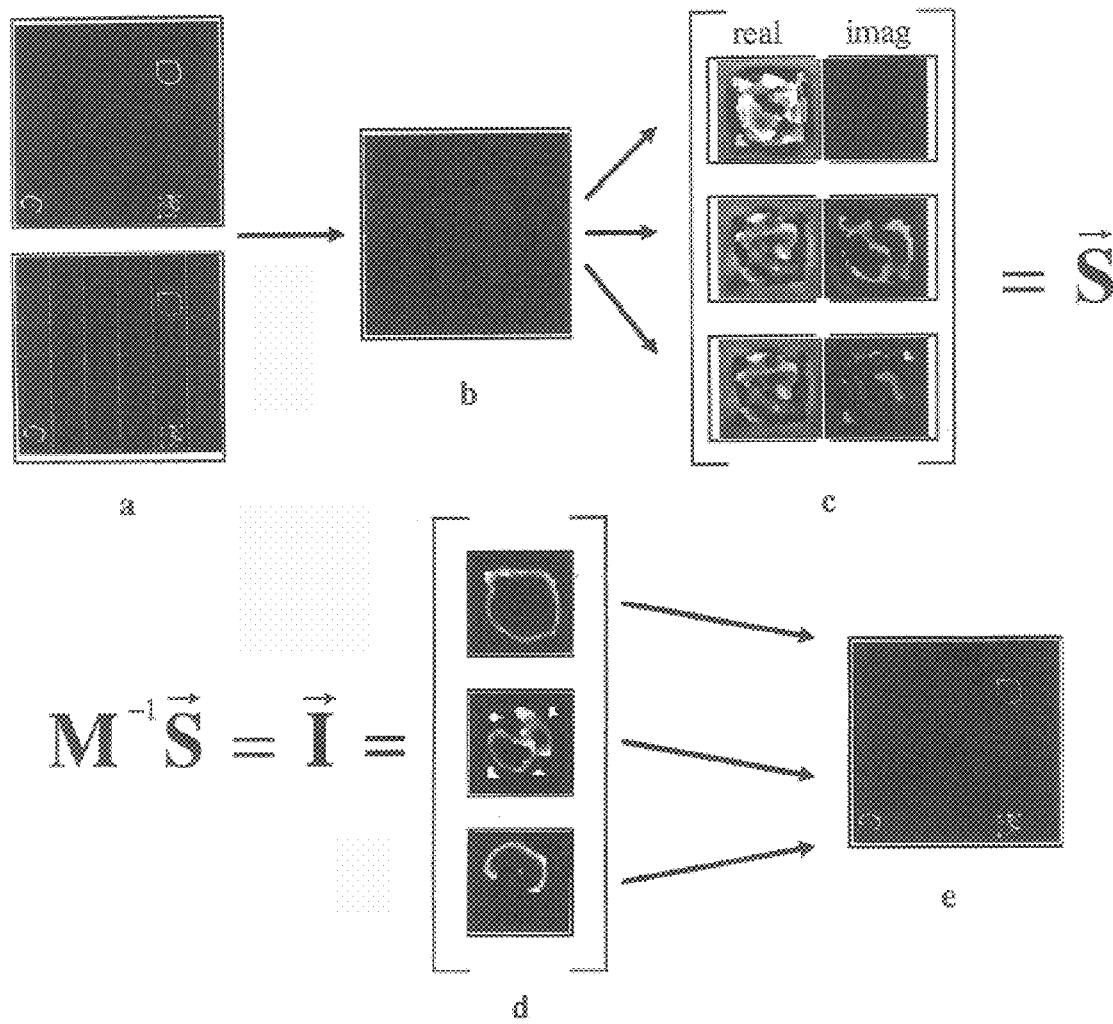
FIG. 1 depicts a schematic outline of an illustrated image reconstruction method in accordance with an embodiment of the invention.

FIG. 2*a*, shows the image to be reconstructed (left panel) consisted of a slowly undulating background component, superposed on an edge component that was supported on only three cells (right panel). FIG. 2*b*, shows the k-space representation of the Hamming filter which may be used to decompose the image into background and edge components. FIG. 2*c*. shows the background component (right panel) and its FT (left panel), which may be used to define the product of the FT of the exact image (panel a) and the Hamming filter (panel b). FIG. 2*d* shows the edge component (right panel) and its FT (left panel), which may be used to define the product of the FT of the exact image (panel a) and the complement of the Hamming filter (panel b). FIG. 2*e* shows the background component (right panel) that may be reconstructed by densely sampling the center of the image's k-space using a keyhole sampling pattern (left panel), applying the low-pass filter (panel b) to these data, and taking the inverse FT of this filtered data. FIG. 2*f* shows the edge component (right panel) that may be reconstructed by sampling the image's k-space on each of the sparse grids forming an mrMR sampling pattern (left panel), applying the complementary high-pass filter to these data, and then applying the mrMR technique (FIG. 1). FIG. 2*g* shows the mrMR image, created by adding the reconstructions of the background and edge components (panels e and f). This image was reconstructed from just ⅓ of the WKS k-space data required to create an image of the entire FOV with the same resolution. This image is windowed identically to the exact image in panel a. FIG. 2*h* shows the error image formed by taking the magnitude of the difference between the mrMR image (panel g) and the exact (WKS) image (panel a). This image has been windowed to accentuate the faint discrepancies.

First, note that the FT of any image can be decomposed into complementary components (FIGS. 2*c* and 2*d*) that are low-pass filtered and high-pass filtered, respectively:

$$\tilde{I}(k_x,k_y)=\tilde{B}(k_x,k_y)+\tilde{E}(k_x,k_y)$$

$$\tilde{B}(k_x,k_y)=\tilde{F}(k_x,k_y)\tilde{I}(k_x,k_y)$$

$$\tilde{E}(k_x,k_y)=[1-\tilde{F}(k_x,k_y)]\tilde{I}(k_x,k_y) \quad (15)$$

where $\tilde{I}(k_x,k_y)$ is the FT of the image and $\tilde{F}(k_x,k_y)$ is the low-pass filter (FIG. 2*b*). If $\tilde{F}(k_x,k_y)$ is chosen wisely, B(x,y) will resemble I(x,y) except in the vicinity of high contrast edges which will be modified by blurring and truncation artifact (FIG. 2*c*), and E(x,y) will vanish everywhere except in the vicinity of the edges of I(x,y) (FIG. 2*d*). By definition, the background component, B(x,y), can be reconstructed from data in a k-space "keyhole" that is bounded by the cut-off of $\tilde{F}(k_x,k_y)$ (FIG. 2*e*). Specifically, data can be acquired on the dense WKS grid in this region, multiplied by $\tilde{F}(k_x,k_y)$, and then subjected to an FFT. The result is B(x,y), which comprises a low resolution version of the filtered image. The mrMR method can be used to reconstruct the edge component, E(x,y), from $\tilde{E}(k_x,k_y)$ measured at optimal sparse k-space locations (FIG. 2*f*). The required values of $\tilde{E}(k_x,k_y)$ can be determined experimentally by measuring the corresponding components of $\tilde{I}(k_x,k_y)$ and multiplying them by the high pass filter $1-\tilde{F}(k_x,k_y)$. Finally, the image I(x,y) is found by summing the reconstructed background and edge components: I(x,y)=B(x,y)+E(x,y), as shown in FIG. 2*g*.

Neither B(x,y) nor E(x,y) will be degraded by noise amplification because both are reconstructed from optimal k-space sampling patterns, determined by the WKS and mrMR sampling theorems, respectively. E(x,y) could be degraded by aliasing if the cut-off frequency of $\tilde{F}(k_x,k_y)$ is too low, causing ringing and blurring patterns in E(x,y) to extend so far from the edges in I(x,y) that they reach beyond the boundaries of the cells used in the mrMR reconstruction. However, this problem can be ameliorated by: 1) using a suitably high cut-off frequency in $\tilde{F}(k_x,k_y)$; 2) designing the shape of $\tilde{F}(k_x,k_y)$ so that the truncation artifact is largely confined to the vicinity of the edges (e.g. a Hamming filter); 3) using cells that are sufficiently large to contain most of the remaining truncation artifact in E(x,y).

In the special case of an image with edges confined to a single region, the filtered mrMR method may be similar to that of certain prior art techniques. Such images may be reconstructed from k-space samples on a single sparse WKS grid, superposed on a pattern of dense sampling in the center of k-space. However, the prior art techniques used a step-like function for $\tilde{F}(k_x,k_y)$. This choice of filter was suboptimal because F(x,y) in this case was a sinc function, and edges in I(x,y) produced non-localized ringing in E(x,y). This tended to increase the region of support of E(x,y) and reduced the efficiency of the method.

D. Simulated Data

Suppose that an image is known to be supported on only three cells (FIG. 3) and that the image is to be reconstructed from data on three coarse grids. FIG. 3 shows image that is supported on only three cells, which are separated from each other by displacement vectors $\vec{d}_{ij}$. In this case, Eq. (14) is equivalent to the following three conditions:

$$e^{i(\vec{k}_1-\vec{k}_3)\cdot\vec{d}_{12}} + e^{i(\vec{k}_2-\vec{k}_3)\cdot\vec{d}_{12}} + 1 = 0$$

$$e^{i(\vec{k}_1-\vec{k}_3)\cdot\vec{d}_{23}} + e^{i(\vec{k}_2-\vec{k}_3)\cdot\vec{d}_{23}} + 1 = 0$$

$$e^{i(\vec{k}_1-\vec{k}_3)\cdot\vec{d}_{31}} + e^{i(\vec{k}_2-\vec{k}_3)\cdot\vec{d}_{31}} + 1 = 0 \qquad (16)$$

where $\vec{d}_{ij}$ (i,j=1, 2, 3) is the displacement vector from the center of the $i^{th}$ cell to the center of the $j^{th}$ cell.

First, consider the special case in which the three cells happen to coalesce into a single rectangular region parallel to the x-axis. Then, we have $\vec{d}_{12} = \vec{d}_{23} = (\Delta x, 0)$ and $\vec{d}_{31} = (-2\Delta x, 0)$, and algebra shows that all solutions to Eq. (16) must satisfy:

$$k_{1x} - k_{3x} = \frac{1}{3}\Delta k_x$$

and $$k_{2x} - k_{3x} = \frac{2}{3}\Delta k_x.$$

The three superposed coarse grids with these offsets comprise the usual WKS sampling pattern for a single region with dimensions $3\Delta x \times \Delta y$. In other words, the general condition for optimal mrMR sampling (Eq. (16)) reduces to the usual sampling theorem in the special case when the three cells coalesce into a single rectangular region. This illustrates the general statement which was proven at the end of IIB: WKS sampling patterns belong to the larger set of optimal mrMR sampling patterns.

Now, suppose that the three cells are at non-collinear locations (FIG. 3). With the help of the fact that $\vec{d}_{12} + \vec{d}_{23} + \vec{d}_{31} = 0$, it can be shown that the only solutions of Eq. (16) are:

$$\vec{k}_1 - \vec{k}_3 = \frac{2\pi}{3}D^{-1}\begin{pmatrix}1+3n_1\\1+3n_2\end{pmatrix} \quad \vec{k}_2 - \vec{k}_3 = -\frac{2\pi}{3}D^{-1}\begin{pmatrix}1+3n_3\\1+3n_4\end{pmatrix}, \qquad (17)$$

where $n_i$ (i=1, ..., 4) are any integers and D is the matrix:

$$D = \begin{pmatrix} d_{12x} & d_{12y} \\ d_{23x} & d_{23y} \end{pmatrix}.$$

For example, consider the image in FIG. 1a, which is supported on only three cells of a 6×6 cell array. In this case, $\vec{d}_{12} = (4\Delta x, 0)$ and $\vec{d}_{23} = (0, 4\Delta y)$, and the solutions in Eq. (17) are $$\vec{k}_1 - \vec{k}_3 = \left(\frac{1}{3}\Delta k_x, \frac{5}{6}\Delta k_y\right)$$

and $$\vec{k}_2 - \vec{k}_3 = \left(\frac{1}{6}\Delta k_x, \frac{2}{3}\Delta k_y\right)$$

when we choose $n_1=1$, $n_2=3$, $n_3=-1$, and $n_4=-3$. FIG. 1b shows the optimal composite sampling pattern, created by superposing these three coarse grids and taking $\vec{k}_3=0$ for convenience. Other optimal sampling patterns can be created by substituting different values for $n_i$. For example, the choices of $n_1=n_2=1$ and $n_3=n_4=-3$ give $$\vec{k}_1 - \vec{k}_3 = \left(\frac{1}{3}\Delta k_x, \frac{1}{3}\Delta k_y\right)$$

and $$\vec{k}_2 - \vec{k}_3 = \left(\frac{2}{3}\Delta k_x, \frac{2}{3}\Delta k_y\right).$$

The mrMR method may be tested by using it to reconstruct the 192×192 image in FIG. 1a from simulated data in an optimal mrMR sampling pattern. Simulated data may be generated by Fourier transformation of the image in FIG. 1a and then sampled sparsely according to the sampling pattern in FIG. 1b. The number of sampled data was 1/12 of the data needed for a conventional FT reconstruction of the entire FOV with the same resolution. These simulated data may be substituted into the right side of Eq. (9) or (10) in order to reconstruct the mrMR version of the image (FIG. 1e).

The filtered mrMR method may be tested by using it to reconstruct the 192×192 image in FIG. 2a from simulated data. The filter, $\tilde{F}(k_x,k_y)$, may be chosen to be a Hamming filter that was cut off along the edges of a 32×32 square in the center of k-space (FIG. 2b). The effect of this filter is shown in FIGS. 2c and 2d, which depict the background and edge components of the image in FIG. 2a. By definition, the background component is band-limited to a 32×32 region of k-space. Therefore, it can be reconstructed exactly from a 32×32 array of data on the WKS grid (FIG. 2e). Notice that the intensity in the edge image in FIG. 2d is confined to the same three cells that support FIG. 1a. Therefore, this edge image should be accurately reconstructed from the sparse mrMR sampling patterns derived for FIG. 1a (namely, the sampling pattern in FIG. 1b or FIG. 2f). The composite sampling pattern may be created by combining the "keyhole" of data required to reconstruct the background component (FIG. 2e) with the edge component sampling scheme (FIG. 2f). These combined data comprised only 1/3 of the complete WKS set. Simulated data may be generated by Fourier transforming the image in FIG. 2a and then sampled sparsely at the locations in FIGS. 2e and 2f. The reconstructed background and edge images (FIGS. 2e and 2f) may be added in order to generate the mrMR version of the image (FIG. 2g). Then, an error image (FIG. 2h) may be formed by taking the magnitude of the difference between the exact image (FIG. 2a) and the mrMR image (FIG. 2g).

E. Phantom Study

To demonstrate the validity of the technique described above, the mrMRI technique was used to image a carotid artery phantom (FIGS. 4 and 5) consisting of two branching plastic tubes having an inner diameter equal to 5 mm. FIG. 4a shows a low resolution "scout" image of the carotid artery phantom, with a superposed 4×8 array of rectangular cells. FIG. 4b shows the same scout image after the cell array was translated and "sheared" in the y-direction so that all the vessels fell within just two cells. Note that translation and shearing of the cell array (possibly on a slice-by slice basis) does not change the optimal sampling pattern dictated by mrMR.

FIG. 5a shows the "exact" image of a typical axial slice of the phantom, generated by FT of 16,384 (128×128) phase-encoded signals. FIG. 5b shows the k-space locations of Fourier components that are optimal for mrMR reconstruction of all slices in the phantom. These comprise less than ⅛ of the WKS data set used to produce the exact image in panel a. FIG. 5c shows the mrMR image of the axial slice in panel a, reconstructed from the signals at the k-space locations in panel b. This image is windowed identically to panel a. FIG. 5d shows the "error" image produced by subtracting the exact image in panel a from the mrMR reconstruction in panel c and windowing the result to increase the conspicuity of the faint discrepancies. FIG. 5e shows MIPs created from all of the exact axial images. FIG. 5f shows MIPs created from the mrMR reconstructions. This image is windowed identically to panel e. FIG. 5g shows an image of the errors in the mrMR MIPs, produced by subtracting the exact MIPs in panel e from the mrMR MIPs in panel f and windowing the result to accentuate the faint discrepancies.

The tubes were filled with a concentrated gadolinium solution (gadodiamide (Omniscan), Nycomed, Inc., Wayne, Pa.) and were immersed in a bath of very dilute gadolinium solution. The phantom was placed in the quadrature birdcage head coil of a 1.5 T whole body scanner (Signa, General Electric Medical Systems, Milwaukee, Wis.). A 3D spoiled gradient echo pulse sequence (17) was used with TR=4.1 ms, TE=1.6 ms, flip angle=20°. This pulse sequence selectively excited a coronal slab that had RL×AP×SI dimensions of 160×160×160 and contained the "arteries". The slab was phase-encoded in the transverse plane and frequency-encoded along the SI direction to produce a 128×128×128 data array, resulting in an isotropic 1.25 mm resolution. These 16,384 k-space signals were obtained in 67 seconds.

Next, a small subset of these signals was used to reconstruct mrMR images of each axial section. The filtered mrMR technique was applied in order to account for the bath's signal intensity, which varied slowly across the entire FOV. The background component of each image was defined by Eq. (15), with $\tilde{F}(k_x,k_y)$ equal to a Hamming filter with a cut-off at the edges of a 32×32 square in the center of k-space. This background image was reconstructed by conventional FFT of the signals that densely sampled this region, after they had been multiplied by the Hamming filter. The complementary edge image was expected to vanish except in the vicinity of the vessels, and was reconstructed from k-space samples in the sparse mrMR pattern dictated by the locations of the vessel-containing cells. In an actual clinical situation, a scout scan of the neck would have been used to ascertain the relative positions of the vessels, as demonstrated in the next section. In the case of the phantom, the vessels were located on low resolution (32×32) axial sections of the above-described coronal slab. The FOV of these axial sections was covered by a 4×8 array of rectangular cells (FIG. 4a) with dimensions: Δx=40 mm and Δy=20 mm. This array was translated and sheared so that the vessels were contained in just two cells (i.e. C=2), which were separated by one empty cell along the x-direction (FIGS. 4a and 4b). As shown below, the contents of the sheared cells can be reconstructed without noise amplification from the optimal mrMR sampling pattern for unsheared cells. An mrMR edge image for each axial section was reconstructed from a sparse subset of the acquired signals, which included the k-space points on two coarse grids, i.e. A=2. The mrMR sampling criterion in Eq. (14) dictates that the offsets of these grids ($\vec{k}_1$ and $\vec{k}_2$) satisfy:

$$e^{i(\vec{k}_1-\vec{k}_2)\cdot\vec{d}}+1=0, \qquad (18)$$

where $\vec{d}$ is the displacement vector from the center of the first cell to the center of the second cell. This equation is satisfied if and only if $$(\vec{k}_1-\vec{k}_2)\cdot\vec{d}=\pi J, \qquad (19)$$

where J is an odd integer. Because the displacement between the centers of the unsheared edge-containing cells was $\vec{d}=(2\Delta x, 0)$, Eq. (19) implies that $$k_{1x}-k_{2x}=\frac{J}{4}\Delta k_x,$$

where $\Delta k_x=2\pi/\Delta x$ and J is any odd integer. This constraint was satisfied with $$J=1, \quad \vec{k}_1=\left(\frac{1}{4}\Delta k_x, 0\right),$$

and $\vec{k}_2=0$, which corresponds to the two coarse grids in FIG. 5b.

Parenthetically, it is interesting to notice what would have happened if the cells had been adjacent ($\vec{d}=(\Delta x,0)$). In that case, Eq. (19) would have dictated that $$k_{1x}-k_{2x}=\frac{J}{2}\Delta k_x,$$

where J is again an odd integer. For all values of J, this implies that the two coarse grids must be offset by $$\frac{1}{2}\Delta k_x$$

with respect to one another, thereby forming the usual WKS sampling pattern for a single rectangular region with dimensions 2Δx×Δy. This example is another illustration of the fact which was proven in general at the end of IIB: the optimal mrMR sampling patterns include to the usual WKS sampling when the cells coalesce into a single rectangular region.

In order to reconstruct the edge component of the image, the data on each of the 32×16 coarse grids was multiplied by the complement of the Hamming filter, and each of these filtered data sets was inverse Fourier transformed. The resulting functions $S_a(x,y)$ were used to compute images of the two sheared edge-containing cells with 1.25 mm×1.25 mm resolution. The resulting edge image was added to the previously-described background image to create the mrMR image (FIG. 5c). This should be compared to the exact image (FIG. 5a), which was reconstructed by FT of the 16,384 data in the complete (128×128) WKS sampling pattern. Notice that the mrMR image was reconstructed from the 1,984 data in the composite sampling pattern (FIG. 5b), which comprised less than ⅛ of the complete data set. FIG. 5d shows the error image that was equal to the magnitude of the difference between the exact image (FIG. 5a) and the mrMR image (FIG. 5c). Finally, maximum intensity projection (MIP) images were created from the exact and mrMR reconstructions (FIGS. 5e and f), and differences between these MIPs were displayed in corresponding error images (FIG. 5g).

As mentioned above, for some axial images, the cell array had to be sheared along the y-axis so that the vessels were contained in just two cells (FIG. 4b). However, it is easy to see that the contents of the sheared cells can still be reconstructed from the mrMR sampling pattern derived for the unsheared cells. In fact, this can be done whenever each non-zero cell occupies a different cell column and the $\vec{k}_a$ offsets all lie on the $k_x$ axis. In this situation, the sparse sample spacing in the $k_y$ direction is determined only by the y-extent of the image intensity in each pixel column, independent of the cell width. Therefore, the 2D mrMR reconstruction is equivalent to a 1D mrMR reconstruction in the x-dimension and a conventional 1D "reduced FOV" reconstruction in the y-dimension. As long as the image intensity in each column does not extend over a segment greater than the height of a single cell (Δy), it can be positioned in a continuous manner anywhere within that particular column, and the resulting cell array will appear to be sheared in the y-dimension. The additional flexibility of this shearing strategy allows one to customize the cell shapes on a slice by slice basis without affecting the optimal mrMR sampling pattern. This reduces both the height of the cells needed to contain the image's edges and the number of k-space points needed to successfully reconstruct the image. It should be noted that this shearing method can also be applied to certain arrangements of supporting cells in which some cell columns contain more than one supporting cell; however, such cases were not encountered in the experiments described here.

F. Patient Study: Gd-Enhanced Carotid MRA

The mrMR method was used to perform first-pass Gd-enhanced 3D MRA of the carotid arteries of a patient volunteer. Informed consent was obtained from the patient, a 68 year-old male who was scheduled to undergo an infused brain MRI. After the uninfused portion of the brain exam was completed, the patient underwent an unenhanced 2D TOF neck MRA with the same neurovascular coil used for the brain study. These images were obtained for comparison to the subsequent Gd-enhanced mrMRA images. 2D TOF was performed with a spoiled gradient echo pulse sequence with TR=23 ms, TE=4.9 ms, flip angle=60°, first order flow compensation, and fractional echo. Each axial section was 1.5 mm thick and was imaged with a 256×224 matrix across a 180 mm×180 mm FOV. Thus, the overall spatial resolution was 0.7 mm×0.8 mm×1.5 mm along the RL×AP×SI directions, respectively. It took 5 seconds to acquire a 2D TOF image of each axial section.

The k-space sampling pattern for the Gd-enhanced mrMRA was planned in an on-line fashion with the help of a scout image of the patient's anatomy. The scout image was the axial MIP ("collapsed" image) of a 2D TOF MRA study of 10 thick axial sections covering the carotid bifurcation. It took 50 seconds to acquire these images with high resolution (256×192) in the transverse plane. However, an adequate scout could easily have been obtained in much less time by increasing slice thickness and decreasing resolution. The scout image was used to create a cell array which could be translated and sheared so that the arteries were contained in just two cells, separated by a single "empty" cell. FIG. 6a shows the resulting cells, which had dimensions equal to 24 mm×30 mm and belonged to an 8×4 array that covered a 190 mm×120 mm region of the FOV. FIG. 6a is an axial "scout" image of the neck of a patient volunteer with a superposed array of cells, just two of which contained the carotid and vertebral arteries. FIG. 6b is the sparse pattern of 862 k-space locations that are optimal for reconstructing an image with edges confined to the two vessel-containing cells in panel a. FIG. 6c is a typical Gd-enhanced axial image reconstructed from data at the sparse k-space locations in panel b. This is the average of two mrMR images, produced from the two 3D mrMRA scans that coincided with the first arterial pass of the contrast agent. FIG. 6d are MIP views of the carotid bifurcations, created from the complete set of mrMRA images like the one in panel c. FIG. 6e is the corresponding MIPs, reconstructed from unenhanced 2D TOF MRA images. Note the loss of TOF flow signal in both carotid bulbs (arrows) which is not observed in the Gd-enhanced MIPs.

The relative positions and dimensions of the cells of FIG. 6a were used to prescribe the k-space sampling pattern to be used in the subsequent Gd-enhanced mrMRA pulse sequence. Because the edge component of the image was expected to vanish (or nearly vanish) except in the two artery-containing cells, Eqs. (9) and (10) could be used to reconstruct it from data on two coarse grids. As in the phantom study, the displacement vector between the centers of the two unsheared supporting cells was $\vec{d}=(2\Delta x, 0)$. Therefore, the mrMR sampling theorem dictated that the two coarse grids be superposed with the optimal offsets (Eq. (19)):

$$\vec{k}_1 = \left(\frac{1}{4}\Delta k_x, 0\right)$$

and $\vec{k}_2=0$, where $\Delta k_x=2\pi/\Delta x$. The dimensions of these grids were chosen to be 20×16, so that the edge image would have spatial resolution equal to 1.2 mm×1.9 mm. The image's background component was reconstructed from the data on a dense 24×10 grid at the center of k-space, after multiplying those data by a Hamming filter covering that region. FIG. 6b shows the composite mrMR sampling pattern, which was comprised of the two large coarse grids, together with the small dense grid. This sampling pattern contained just 862 of the 10,240 WKS measurements required to achieve uniform 1.2 mm×1.9 mm resolution throughout the entire FOV.

The patient was infused with 0.3 mM/kg of gadodiamide contrast agent (Omniscan, Nycomed, Wayne, Pa.) over a 25 second time period. The mrMRA scan was performed repetitively before, during, and after the injection, using a 3D spoiled gradient echo pulse sequence (17) with TR=8 ms, TE=1.7 ms, and flip angle=45°. A 120 mm thick coronal slab was selectively excited. It was frequency-encoded along the SI direction in order to produce 1.2 mm thick axial sections.

The signals were phase-encoded along the x (RL) and y (AP) axes according to the composite sampling pattern shown in FIG. 6b. It took just seven seconds to acquire the 862 phase-encoded signals in this pattern. The mrMRA pulse sequence was run seven times in quick succession over a 49 second time period that began seven seconds before the infusion and ended seventeen seconds after the completion of the infusion. In this way, acquisition of a complete mrMR data set was ensured during the first arterial pass of contrast agent without the need for "hit or miss" bolus timing techniques.

The signals from non-vascular tissues were suppressed by subtracting the pre-infusion mrMRA data from each subsequent data set. In order to identify the arterial phase, low resolution images were reconstructed from each subtracted mrMRA data set by 2D FT of the signals in the center of k-space. As shown in FIG. 7, these images clearly demonstrate early arterial enhancement, followed by venous enhancement.

FIG. 7 shows low resolution axial images of the neck of the patient volunteer in FIG. 6, at six time intervals after the Gd infusion. These images were produced by 2D FT of the signals acquired in the center of k-space during each of the last six Gd-enhanced mrMRA scans, after the corresponding signals from the first scan were subtracted in order to suppress the intensity of stationary tissues.

In order to maximize contrast-to-noise, the subtracted data from the fourth and fifth scans was averaged, both of which showed arterial enhancement without significant venous signal. The subtracted data in the densely sampled square at the center of k-space were multiplied by the Hamming filter that covered that area, and the background component of the mrMR image was reconstructed by FFT of this filtered data. The edge component of the mrMR image was reconstructed from the subtracted data on the two coarse k-space grids, after the data had been multiplied by the complement of the Hamming filter (see Eq. (15)) and Fourier transformed. The complete mrMR image was calculated by adding the resulting edge component to the background component (FIG. 6c). Finally, MIPs of the mrMRA reconstructions were created and compared to MIPs of the unenhanced 2D TOF images acquired prior to infusion (FIGS. 6d and e).

Results

A. Simulated Data

FIG. 1e shows the mrMR reconstruction of the simulated image in FIG. 1a. The two images are identical to within round-off error, despite the fact that the former image was reconstructed from 1/12 of the data used to reconstruct the latter one. FIG. 2g shows the mrMR reconstruction of the simulated image in FIG. 2a. Notice the accuracy of the result, even though it was reconstructed from sparse data (FIGS. 2e and 2f) which comprised only 1/8 of the complete FT data set. FIG. 2h is the error image, which is the magnitude of the difference between the mrMR image and the exact image. This image is windowed to show the discrepancies. These errors were caused by some low spatial frequencies in the edge component which were outside the three supporting cells and led to aliasing when this edge image was reconstructed by mrMR. Notice that this error is comprised solely of low frequency image components; i.e. the image's edges are reconstructed faithfully.

B. Phantom Experiments

FIG. 5a shows the exact image of a typical slice at the level of the tubing bifurcations, reconstructed from the complete set of 16,384 data required to image the entire FOV with an isotropic 1.25 mm resolution. FIG. 5c shows the mrMR image that was created from sparse data at the k-space locations in FIG. 5b, which comprised less than 1/8 of the complete FT data set. FIG. 5d is the error image, equal to the magnitude of the difference between the mrMR image and the exact image. This image is windowed to increase the conspicuity of the faint aliasing artifacts. The error image also shows truncation artifacts at the surface of the bath, which was outside the two edge-containing cells. FIGS. 5e and 5f show maximum intensity projections (MIPs) created from the exact and mrMR reconstructions, respectively. Notice that the mrMR MIP accurately depicts the tiny "step-off" discontinuities of the lumen where the caliber of the tubing changes abruptly. These features resemble minimal atherosclerotic plaques. Only faint artifacts are present, as demonstrated by the MIP error image (FIG. 5g), which is windowed to accentuate these discrepancies.

C. Gd-Enhanced Carotid MRA

FIG. 6c shows a typical axial mrMR image that was reconstructed from the data at the 862 k-space locations in FIG. 6b. FIG. 6d shows MIP images derived from mrMR images of 60 such axial sections. These should be compared to the MIPs of the unenhanced 2D TOF images in FIG. 6e. Notice that the 2D TOF MIPs are degraded by signal loss in the carotid bulbs, which are the most common locations of atherosclerotic plaques. In contrast, the mrMRA MIPs depict the full extent of the carotid bulbs.

Discussion

If the FT of a signal is limited to a single band, the WKS sampling theorem shows how to collect the minimum number of samples from which the entire signal can be reconstructed without noise amplification. Conventional FT MRI is based on this theorem. A more general sampling theorem is described below which shows how to sample the k-space of an image that vanishes except in multiple regions (i.e. it is "multi-banded" in image space). These data can be used to reconstruct the image without noise amplification; i.e. the image has the same noise level as a comparable conventional FT image with the same spatial resolution over the same total area of support. Furthermore, it is demonstrated below that this method can be modified to handle a larger class of images: those that have slowly varying signal intensity across the entire FOV and high-contrast edges confined to small regions. The "background" component of such an image can be reconstructed from densely sampled data in the center of k-space, while its "edge" component can be reconstructed from the sparse k-space samples dictated by the new sampling theorem.

If the edge-containing regions cover only a small portion of the FOV, the image can be reconstructed without noise amplification from a sparse subset of the complete (WKS) data set. This makes it possible to use prior knowledge of the object to increase the efficiency of the sampling process. This can be advantageous in several ways. In many cases, mrMR images can be acquired in less time (or with greater spatial resolution) because it takes fewer TR intervals to sample the image at the sparse mrMR k-space locations than at the more numerous WKS points. Furthermore, if k-space trajectories are used to collect multiple k-space samples per TR interval, lower bandwidth and/or shorter read-out time (trajectory traversal time) can be used because it is only necessary to visit the sparse k-space locations needed by mrMRI. Reducing the bandwidth leads to increased signal-to-noise, while shortening the read-out time tends to reduce artifacts due to off-resonance effects.

It should be noted that the mrMR method is computationally cheap, because images are formed from linear combinations of small FFTs of the data. For imaging situations in which the supporting cells occupy only a small fraction of the entire FOV, the reconstruction process is computationally cheaper than that of conventional FT MRI, because the latter involves a single large FFT. In the experiments discussed here, a single R10000 processor 104 (Silicon Graphics, Inc., Mountain View, Calif.) computed each mrMR image in a small fraction of a second. In fact, in the current implementation, the speed of mrMR image reconstruction was limited by extraneous factors, such as the time required for the Unix script to call the reconstruction routine and the time required to print a message on the user's screen.

The mrMR method was applied to simulated data and to experimental data from a vascular phantom. When the resulting images were compared to "exact" images, it was apparent that there was no noise amplification and that little aliasing or truncation artifact was produced by the presence of a slowly undulating background intensity. It was also shown how mrMRI could be used to perform first-pass Gd-enhanced 3D carotid MRA in just 7 seconds. The exam was performed in a fashion analogous to conventional angiography: namely, a series of 3D mrMRA scans was performed before, during, and after the injection of contrast agent. The resulting data were used to retrospectively identify the first arterial pass of contrast. In other words, it was not necessary to "catch" the arterial phase with bolus timing procedures, which can be operator-dependent and patient-dependent (13–16). Bolus timing can be particularly ticklish for Gd-enhanced carotid imaging because the internal jugular veins enhance within 10 seconds of the first arterial pass of contrast agent and because they are immediately adjacent to the carotid arteries.

The mrMRI method may also be useful in other imaging situations in which the high spatial frequencies are known to be confined to multiple regions of the FOV. For example, this type of prior knowledge may be available in functional MRI, interventional MRI, and MR spectroscopic imaging, as well as in other applications of MRA. Three-dimensional MR spectroscopic imaging may benefit from extensions of mrMRI to higher dimensions. Moreover, the new sampling theorems might increase the sampling efficiency of other Fourier imaging modalities, such as radio astronomy, radar, and crystallography. It may also be applied in telecommunications for the purpose of digitizing and reconstructing signals with frequency components in multiple frequency bands.

There are two principle sources of image degradation in mrMRI reconstructions. First of all, the SNR of mrMR images is limited by the total number of measured signals, just as in conventional FT reconstruction. The SNR of our carotid mrMRA images was suboptimal because they were reconstructed from just 862 k-space samples and because no attempt was made to optimize our pulse sequence and infusion protocol. Secondly, any high spatial frequency features (i.e. edges) which fall outside of our specified cells (thereby violating our assumptions) will alias into these cells. These artifacts can be minimized by using techniques that increase the contrast of edges within the specified cells and simultaneously suppress the contrast of edges outside of these cells. Image quality may also be improved by: 1) optimization of the contrast-to-noise of the pulse sequence (e.g. use of fat suppression, fractional echoes, and more suitable values of the TR, bandwidth, and flip angle parameters); 2) utilization of a power injector in order to increase the concentration of gadodiamide in the blood; 3) use of better spatial filters for separating the image into background and edge components; 4) creation of the mrMRA images from temporally-filtered signals collected during all seven mrMR scans (not just during one or two arterial acquisitions as in IIIC). By making use of data from all of the mrMRA acquisitions, significantly higher SNR may be achieved (e.g., 2–3 times higher). Similar temporal filtering methods have been developed for conventional X-ray angiography.

The mathematical literature on sampling theorems has been reviewed for previous work related to the mrMR method. The most closely related work is that of Bezuglaya and Katsnelson, who derived sampling theorems for one-dimensional signals with limited multi-band spectra. However, their result differs significantly from the method described above in that they do not demand that the samples suffice to reconstruct the signal without noise amplification. Instead, they looked for sampling patterns which could be used to reconstruct the signal under less stringent conditions. Furthermore, these authors did not consider the sampling of functions in greater than one dimension.

It is instructive to compare mrMRI to Locally Focused MRI (LF MRI), also developed by the inventors. In most situations, the mrMR method is preferable because it avoids the noise amplification of LF MRI and because it is computationally much cheaper than LF MRI. In order to perform LF MRI, the first step is to generate a set of non-Fourier basis functions that span the space of all images having the pattern of spatial variation suggested by prior knowledge. The Fourier components of the image are linearly related to the image's projections onto these LF basis functions. Therefore, these linear equations can be inverted to calculate the basis function coefficients in terms of an equal number of measured Fourier components. If our prior knowledge is strong enough to be expressed by a small number of basis functions, the image can be reconstructed from a small number of k-space samples. Notice that the LF MRI method is quite general, allowing the user to exploit prior knowledge of the image's general pattern of spatial variation in multiple regions of irregular shape. The main problem is that LF images are degraded by noise amplification, caused by ill-conditioning of the matrix inversion required to find the basis function coefficients. The elements of this matrix depend on the k-space sampling pattern, as well as on the form of the basis functions dictated by our prior knowledge. In general, it has not been possible to find minimal k-space sampling patterns that make this matrix well-conditioned (i.e. that make its singular values approximately equal). In order to make the problem better conditioned, it has been necessary to over-determine its solution by sampling 4–6 times more k-space points than the number of basis functions. Of course, this is undesirable because it increases scan time by a factor of 4–6 above the minimal LF MRI requirements. The second disadvantage of the LF technique is its computational expense. Image reconstruction requires the inversion of a matrix that has dimensions equal to the number of basis functions, which is itself proportional to the total area of the edge-containing regions. For example, a 400×400 matrix was inverted in order to reconstruct Gd-enhanced MRA images of the carotid arteries with isotropic 1.25 mm resolution. It took approximately 30 seconds for a single R10000 processor (Silicon Graphics, Inc., Mountain View, Calif.) to perform this computation with a QR factorization algorithm. In many applications, this computation may have to be performed only once for a given patient; i.e. it need not be repeated on a slice-by-slice basis if the k-space sampling and prior knowledge are the same for all slices. However, the expense of this computation increases rapidly with the matrix dimension. Therefore, it could become a limiting factor if the prior knowledge is not strong enough to effectively limit the number of basis functions.

Notice that mrMRI utilizes prior knowledge of the approximate locations of edges, but no assumptions are made about the configurations of those edges. Therefore, mrMRI is less model-dependent than methods which assume that the edge configurations of the unknown image are similar to those of prior images of the subject. For example, in one prior publication entitled "Reduced encoding Imaging by Generalized series Reconstruction" (RIGR), the image is expressed in terms of a small number of basis functions that are products of slowly varying Fourier functions and a high resolution baseline image of the subject's anatomy. Therefore, all edges in a RIGR image must have the same configuration as the edges in the anatomical reference image, and problems can be expected if the unknown image contains new sharp edges. In "Feature-Recognizing MRI", a reduced basis set is identified as the principal components of "training" images of other subjects, who are thought to resemble the unknown subject. Images of the unknown subject are found by computing the basis function coefficients from a reduced set of k-space samples. Of course, these images will only be accurate to the extent to which the unknown subject resembles the collection of training subjects. Furthermore, both "feature-recognizing" and RIGR images will suffer from noise amplification because the computation of basis function coefficients is usually not well-conditioned. In "Singular Value Decomposition MRI" (SVD MRI), a reduced basis set is derived from the singular value decomposition (SVD) of a single prior image of the subject. This is mathematically equivalent to applying the "feature-recognizing" procedure to the collection of columns in that image. Other investigators have found that this method is model-dependent in the following sense: the SVD basis functions may not accurately represent new edges which are present in the image of interest but were not present in the prior image. Furthermore, SVD MRI also suffers from inherently low SNR. Zientara et al implemented SVD MRI by using direct RF excitation to encode signals with the profiles of the basis functions. In this way, the object's projection onto each basis function can be measured directly, and it is possible to avoid the ill-conditioned computation of the basis function coefficients from Fourier encoded signals. Unfortunately, direct excitation requires the use of variable flip angles across the excitation profile, and this may produce 3–4 times less signal than that obtained with a uniform flip angle excitation followed by Fourier encoding.

OTHER EMBODIMENTS

In another illustrated embodiment, the method of reconstructing images is extended to time dependent signals. As used herein, a time dependent signal may be any information-containing signal transmitted in the radio frequency, microwave, infrared, or visible range.

The process of reconstructing time dependent signals is very similar to reconstruction of MR and other images. For example, MR images are reconstructed from samples of the image's Fourier representation at certain locations in the Fourier space (k-space). The frequency representation of a time dependent signal can be considered to be a one-dimensional image. The Fourier representation of that 1D image is the time dependent signal itself. Just as in MRI, such a 1D image can be reconstructed from samples of its Fourier representation at certain locations in the Fourier space; in other words, the signal's frequency representation can be reconstructed from samples of the time dependent signal at certain times. Then, the resulting frequency representation of the signal can be Fourier transformed to reconstruct the time-dependent signal at any time.

The method of sampling and reconstructing time dependent signals may be used to transmit, receive, and reconstruct signals that have frequency components in multiple, possibly non-adjacent frequency bands. For example, it may be desirable to transmit a certain amount of information to a receiver over a certain period of time. However, there may not be an available band of frequency that is broad enough to permit the information to be transmitted in the desired time interval. If a sufficient number of narrow bands of frequency are available, the described invention makes it possible to use those multiple narrow frequency bands to transmit the information in the desired time interval. This process is described in the following example.

The transmitter and receiver would have prior knowledge of the frequency locations of the narrow bands to be used for the subsequent data transmission. For example, in a cellular telephone system, the base unit in the cell of the roaming unit would determine which multiple frequency bands are to be used for communication with the roaming unit, and the base unit would transmit the identity of those multiple frequency bands to the roaming unit.

The transmitting unit would then proceed to use all of these narrow frequency bands to transmit the data-containing signals to the receiving unit.

The receiving unit would receive signals over a wide band of frequencies that contains the multiple narrow bands used for the signal transmission. The receiving unit would use analogue or digital filters to suppress all signals that are in that wide band but are outside the narrow bands used for signal transmission.

The receiving unit would use the known locations and breadths of the narrow frequency bands to determine the times at which the filtered signal should be sampled digitally. In general, the temporal sampling pattern would be comprised of a superposition of coarse sampling patterns. Each such coarse pattern would be suitable for Fourier transform reconstruction of any signal with frequency components in just one of the narrow bands. Also, each such coarse pattern would have a different temporal off-set, such off-sets being chosen in order to make the eigenvalues of the reconstruction matrix comparable to one another.

The receiving unit would sample the filtered signal at the prescribed times and store the sampled data.

The receiving unit would Fourier transform subsets of the stored sampled data and use the reconstruction matrix to linearly combine those Fourier transforms in order to reconstruct the signal's frequency components in each narrow frequency band.

The receiving unit would inverse Fourier transform the signal's components in each narrow frequency band in order to reconstruct the time dependent signals contained in those narrow bands.

A specific embodiment of a novel method and apparatus for reconstructing images according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A method of transceiving a signal comprising the steps of:
    transmitting a superposed frequency component of the signal within each of a plurality of non-adjacent frequency bands;
    using analogue or digital filters within a receiver to suppress all signals outside the plurality of frequency bands and to pass a filtered signal within the plurality of non-adjacent frequency bands;
    determining a set of substantially non-uniformly spaced times at which the filtered signal within the plurality of non-adjacent frequency bands should be sampled;
    sampling the filtered signal at the determined times to provide sampled data;
    Fourier transforming subsets of the sampled data;
    linearly combining the Fourier transformed subsets using a reconstruction matrix; and
    extracting the signal from the linear combinations of the Fourier transformed subsets.

2. The method of transceiving a signal as in claim 1 further comprising providing a transmitting communication unit and a receiving communication unit for transceiving the signal.

3. The method of transceiving a signal as in claim 2 further comprising providing the transmitting communication unit and receiving communication unit with prior knowledge of the spectral locations and bandwidths of the plurality of non-adjacent frequency bands.

4. The method of transceiving a signal as in claim 1 further comprising dividing the signal into a plurality of frequency components and assigning some, but not all, to each frequency band of the plurality of frequency bands.

5. The method of transceiving a signal as in claim 4 further comprising using data to define the signal.

6. The method of transceiving a signal as in claim 5 further comprising representing the data as a set of data components and using each data component to define one of the plurality of frequency components.

7. The method of transceiving a signal as in claim 1 further comprising transceiving the signal in at least one of the radio frequency, microwave, infrared, and visible ranges.

8. The method of transceiving a signal as in claim 1 further comprising transceiving the signal on one of wireless and wireline signaling networks, such signal having frequency components in the plurality of non-adjacent frequency bands.

9. The method of transceiving a signal as in claim 3 further comprising having one of the transmitting and receiving unit transmit the provided knowledge of the locations and bandwidths of the plurality of non-adjacent narrow frequency bands to the other of the transmitting and receiving unit.

10. The method of transceiving a signal as in claim 1 wherein the step of sampling the filtered signal further comprises sampling the filtered signal according to a superposition of coarse sampling patterns, each such coarse sampling pattern being suitable for Fourier transform reconstruction of any signal with frequency components in one of the frequency bands and each such coarse sampling pattern having a different temporal offset.

11. The method of transceiving a signal as in claim 10 further comprising selecting the temporal offset values and selecting the locations and bandwidths of the frequency bands.

12. The method of transceiving a signal as in claim 11 further comprising selecting the values of the temporal offsets and locations and bandwidths of the frequency bands to provide the reconstruction matrix with comparable eigenvalues.

13. The method of transceiving a signal as in claim 10 further comprising having the transmitting unit transmit to the receiving unit the values of the temporal offsets, said transmission occurring prior to transmission of the signal.

14. The method of transceiving a signal as in claim 2 further comprising having the transmitting unit transmit the elements of the reconstruction matrix to the receiving unit, said transmission occurring prior to transmission of the signal.

15. The method of transceiving a signal as in claim 4 further comprising extracting the frequency components of the signal from linear combinations of the Fourier transformed subsets formed within the receiver.

16. The method of transceiving a signal as in claim 15 further comprising inverse Fourier transforming the frequency components in each of the plurality of frequency bands in order to reconstruct the time-dependent signals contained in those frequency bands within the receiver.

17. A method of receiving a signal transmitted within a plurality of non-adjacent frequency bands, such method comprising the steps of:
    using analogue or digital filters within a receiver to suppress all signals outside the plurality of frequency bands and to pass a filtered signal within the plurality of non-adjacent frequency bands;
    determining a set of substantially non-uniformly spaced times at which the filtered signal within the plurality of non-adjacent frequency bands should be sampled;
    sampling the filtered signal at the determined times to provide sampled data;
    Fourier transforming subsets of the sampled data;
    linearly combining the Fourier transformed subsets using a reconstruction matrix; and
    extracting the signal from the linear combinations of the Fourier transformed subsets.

18. An apparatus for transceiving a signal comprising the steps of:
    means for transmitting a superposed frequency portion of the signal within each of a plurality of non-adjacent frequency bands;
    means for using analogue or digital filters within a receiver to suppress all signals outside the plurality of frequency bands and to pass a filtered signal within the plurality of non-adjacent frequency bands;
    means for determining a set of substantially non-uniformly spaced times at which the filtered signal within the plurality of non-adjacent frequency bands should be sampled;
    means for sampling the filtered signal at the determined times to provide sampled data;
    means for Fourier transforming subsets of the sampled data;
    means for linearly combining the Fourier transformed subsets using a reconstruction matrix; and
    means for extracting the signal from the linear combinations of the Fourier transformed subsets.

19. The apparatus for transceiving a signal as in claim 18 further comprising means for providing a transmitting communication unit and a receiving communication unit for transceiving the signal.

20. The apparatus for transceiving a signal as in claim 18 further comprising means for providing the transmitting communication unit and receiving communication unit with prior knowledge of the spectral locations and bandwidths of the plurality of non-adjacent frequency bands.

21. The apparatus for transceiving a signal as in claim 18 further comprising means for dividing the signal into a plurality of frequency components and assigning some, but not all, to each frequency band of the plurality of frequency bands.

22. The apparatus for transceiving a signal as in claim 21 further comprising means for using data to define the signal.

23. The apparatus for transceiving a signal as in claim 22 further comprising means for representing the data as a set of data components and using each data component to define one of the plurality of frequency components.

24. The apparatus for transceiving a signal as in claim 18 further comprising means for transceiving the signal in at least one of the radio frequency, microwave, infrared, and visible ranges.

25. The apparatus for transceiving a signal as in claim 18 further comprising means for transceiving the signal on one of wireless and wireline signaling networks, such signal having frequency components in the plurality of non-adjacent frequency bands.

26. The apparatus for transceiving a signal as in claim 20 further comprising means for having one of the transmitting and receiving unit transmit the provided knowledge of the locations and bandwidths of the plurality of non-adjacent narrow frequency bands to the other of the transmitting and receiving unit.

27. The apparatus for transceiving a signal as in claim 18 wherein the means for sampling the filtered signal further comprises means for sampling the filtered signal according to a superposition of coarse sampling patterns, each such coarse sampling pattern being suitable for Fourier transform reconstruction of any signal with frequency components in one of the frequency bands and each such coarse sampling pattern having a different temporal offset.

28. The apparatus for transceiving a signal as in claim 27 further comprising means for selecting the temporal offset values and selecting the locations and bandwidths of the frequency bands.

29. The apparatus for transceiving a signal as in claim 28 further comprising means for selecting the values of the temporal offsets and locations and bandwidths of the frequency bands to provide the reconstruction matrix with comparable eigenvalues.

30. The apparatus for transceiving a signal as in claim 27 further comprising means for having the transmitting unit transmit to the receiving unit the values of the temporal offsets, said transmission occurring prior to transmission of the signal.

31. The apparatus for transceiving a signal as in claim 19 further comprising means for having the transmitting unit transmit the elements of the reconstruction matrix to the receiving unit, said transmission occurring prior to transmission of the signal.

32. The apparatus for transceiving a signal as in claim 21 further comprising means for extracting the frequency components of the signal from linear combinations of the Fourier transformed subsets formed within the receiver.

33. The apparatus for transceiving a signal as in claim 32 further comprising means for inverse Fourier transforming the frequency components in each of the plurality of frequency bands in order to reconstruct the time-dependent signals contained in those frequency bands within the receiver.

34. An apparatus for transceiving a signal comprising the steps of:
- a transmitter adapted to transmit a superposed frequency portion of the signal within a plurality of non-adjacent frequency bands;
- a receiver, said receiver further comprising;
- a set of filters located within the receiver and adapted to suppress all signals outside the plurality of frequency bands and to pass a filtered signal within the plurality of non-adjacent frequency bands;
- a timing processor adapted to determine a set of substantially non-uniformly spaced times at which the filtered signal within the plurality of non-adjacent frequency bands should be sampled;
- a sampling processor adapted to sample the filtered signal at the determined times to provide sampled data;
- a Fourier processor adapted to Fourier transform subsets of the sampled data;
- a reconstruction matrix adapted to linearly combining the Fourier transformed subsets; and
- an extraction processor adapted to extract the signal from the linear combinations of the Fourier transformed subsets.

* * * * *